United States Patent [19]

Awano

[11] Patent Number: 5,027,164
[45] Date of Patent: Jun. 25, 1991

[54] SEMICONDUCTOR DEVICE

[75] Inventor: Yuji Awano, Tokyo, Japan

[73] Assignee: Fujitsu Limited, Kawasaki, Japan

[21] Appl. No.: 327,702

[22] Filed: Mar. 23, 1989

[30] Foreign Application Priority Data

Mar. 23, 1988 [JP] Japan .................. 63-68758

[51] Int. Cl.$^5$ ............................ H01L 27/12
[52] U.S. Cl. ......................... 357/4; 357/16; 357/17; 357/30
[58] Field of Search ............ 357/4 SL, 4, 16, 17, 357/30

[56] References Cited

U.S. PATENT DOCUMENTS

| 4,438,446 | 5/1981 | Tsang | 357/4 SL |
| 4,731,789 | 3/1988 | Thornton | 357/4 SL |
| 4,794,611 | 12/1988 | Hara | 357/4 SL |

FOREIGN PATENT DOCUMENTS

| 0152178 | 9/1982 | Japan | 357/4 SL |
| 0171186 | 9/1984 | Japan | 357/4 SL |

Primary Examiner—Martin H. Edlow
Assistant Examiner—R. Ratliff
Attorney, Agent, or Firm—Staas & Halsey

[57] ABSTRACT

A semiconductor device generally has an anode layer, a first semiconductor layer, a first cladding layer having a superlattice structure, an active layer having a superlattice structure, a second cladding layer having a superlattice structure, a cathode barrier layer, a second semiconductor layer, and a cathode layer. The cathode barrier layer allows electrons to tunnel therethrough when a voltage is applied across the anode and cathode layers so that a potential on a side of the superlattices is positive with respect to the cathode barrier layer. The active layer has the superlattice with a bottom energy of a miniband from which electrons transit to a lower miniband with a light emission which bottom energy is smaller than those of the superlattices of the first and second cladding layers.

16 Claims, 10 Drawing Sheets

GaAs

FIG. 4B (PRIOR ART)

GaAs/AlGaAs···/GaAs

SEMICONDUCTOR DEVICE

BACKGROUND OF THE INVENTION

The present invention generally relates to semiconductor devices, and more particularly to a semiconductor device applicable to a semiconductor laser having a GaAs/AlGaAs system compound semiconductor heterojunction and capable of easily obtaining an arbitrary light emission wavelength over a wide range.

Semiconductor lasers and light emitting diodes generate to the outside a light which is generated at a time of a recombination, that is, a light emitting phenomenon which occurs due to an electron transition in an energy gap between the valence and conduction bands. However, the light emission wavelength of such semiconductor lasers and light emitting diodes is determined by an energy gap peculiar to the material used. For this reason, it is necessary to produce a mixed crystal semiconductor including three or four elements in order to obtain a desired light emission wavelength especially over a wide range, but it is difficult to obtain a satisfactory single crystal.

Accordingly, there is a demand to realize a semiconductor device capable of easily obtaining an arbitrary light emission wavelength over a wide range and obtaining a satisfactory single crystal.

On the other hand, it is possible to produce a superlattice, that is, a periodic repetition of different semiconductors like AlGaAs/GaAs/AlGaAs/GaAs by use of a crystal growing method such as a molecular beam epitaxy (MBE) which can control a thickness of a grown layer with a high accuracy. There has been reports that a band structure of the conduction band in such a superlattice splits into mini-bandgaps.

Figure 1:
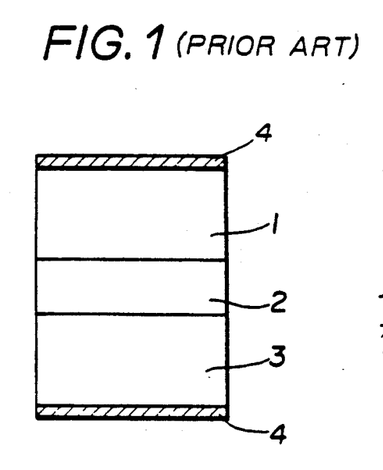
FIG. 1 is a cross sectional view showing a structure of an example of a conventional semiconductor laser.
Figure 2:
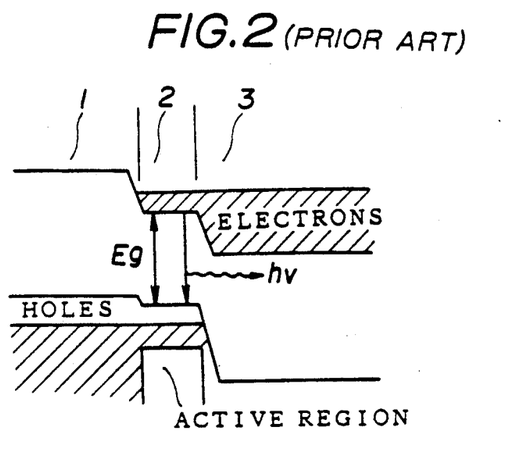
FIG. 2 is a diagram for explaining trapping of carriers in the conventional semiconductor laser shown in FIG. 1.
Figure 3:
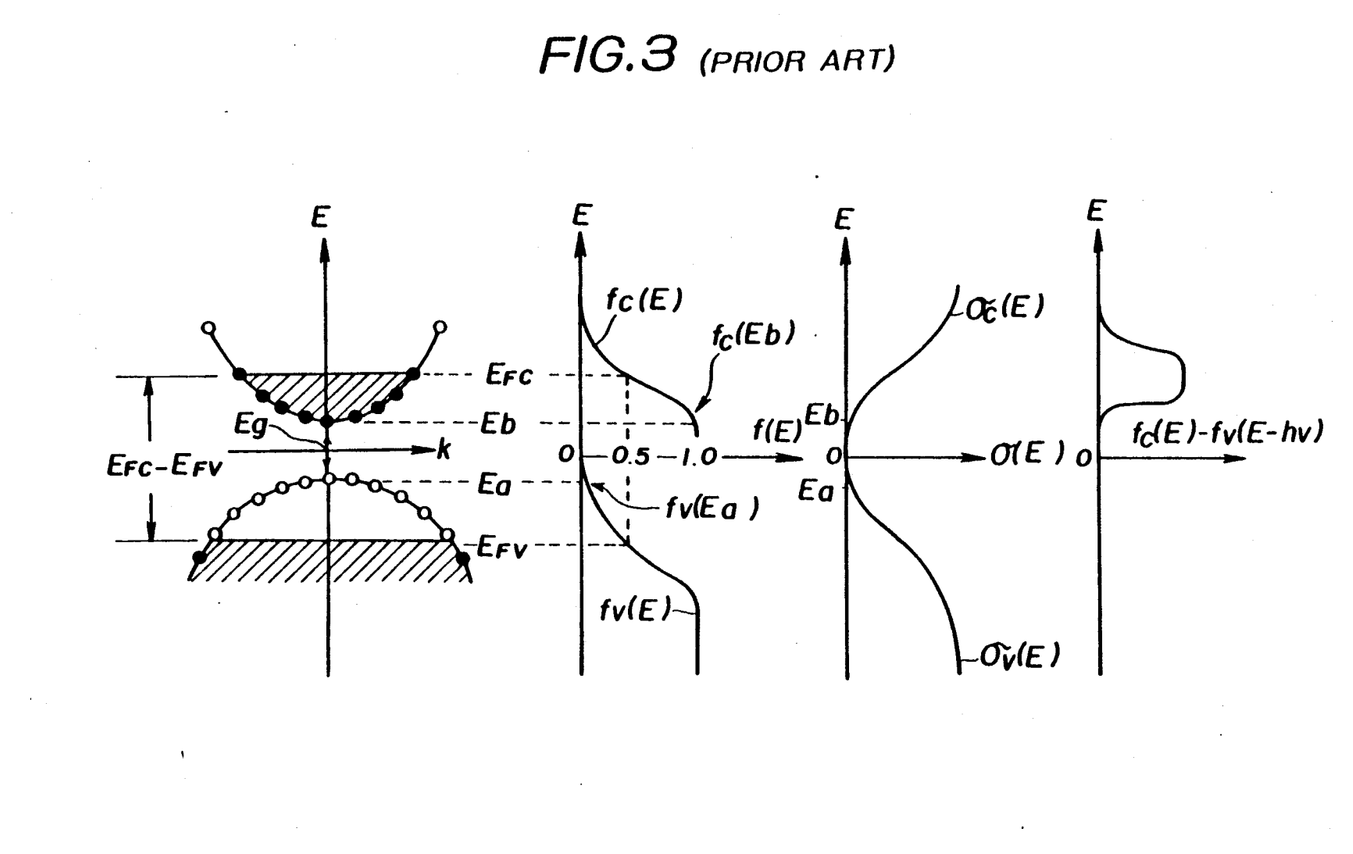
FIG. 3 is a diagram for explaining a band structure, a distribution function and a density of states of the conventional semiconductor laser shown in FIG. 1.
Figure 4A:
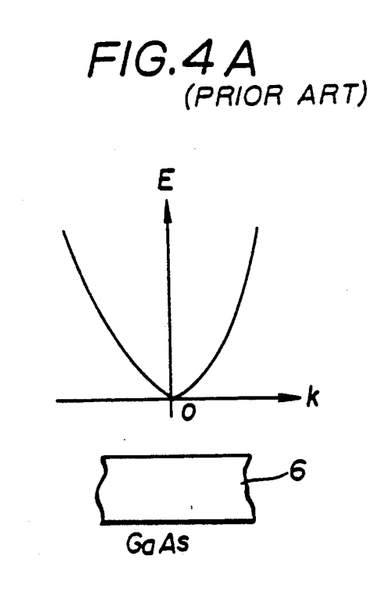
FIGS. 4A and 4B are diagrams for explaining band structures of a bulk GaAs and a superlattice.
Figure 4B:
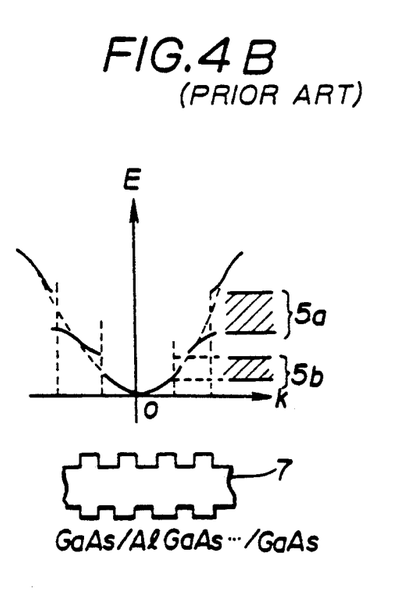

FIG. 1 shows a cross sectional structure of an example of a conventional semiconductor laser, and FIG. 2 is a diagram for explaining trapping of carriers in the conventional semiconductor laser shown in FIG. 1. FIG. 3 is a diagram for explaining a band structure and a distribution function of the conventional semiconductor laser shown in FIG. 1, and FIGS. 4A and 4B are diagrams for explaining band structures of a bulk GaAs and a superlattice.

In FIG. 1, the semiconductor laser has a p-type AlGaAs cladding layer 1, a p-type GaAs active layer 2, an n-type AlGaAs cladding layer 3, and electrodes 4. In FIGS. 2 and 3, Eg denotes an energy band gap, E denotes an energy, k denotes a wave number, $E_{FC}$ denotes a Fermi level in a conduction band, $E_{FV}$ denotes a Fermi level in a valence band, Ea denotes an energy at a top of the valence band, Eb denotes an energy at a bottom of the conduction band, f(E) denotes a distribution function of electrons, fc(E) denotes a distribution function of electrons in the conduction band, fv(E) denotes a distribution function of electrons in the valence band, fc(Eb) denotes a distribution function of electrons at the energy at the bottom of the conduction band, fv(Ea) denotes a distribution function of electrons at the energy at the top of the valence band, $\sigma(E)$ denotes a density of states, $\sigma_c(E)$ denotes a density of state in the conduction band, and $\sigma_c(E)$ denotes a density of state in the valence band. In FIGS. 4A and 4B, 5a and 5b respectively denote mini-bandgaps formed in the conduction band and corresponding to forbidden bands, 6 denotes a band structure of a bulk GaAs, and 7 denotes a band structure of a superlattice made up of GaAs/AlGaAs/ . . . /GaAs.

A description will now be given of the operating principle of the conventional semiconductor laser shown in FIG. 1. As shown in FIG. 2, the electrons and holes are trapped in the same space in the energy bandgap Eg between the valence and conduction bands and the semiconductor laser uses a light hv generated at a time of a recombination of the electrons and holes. The electrons and holes are successively injected by applying a voltage across the electrodes 4. In addition, as shown in FIG. 3, the condition for amplification for continuous light emission is that a population inversion occurs. The condition may be expressed by the following, where B is a transition rate for stimulated emission and $\rho$ is the photon number.

$$B\rho \int \sigma_c(E)\sigma_v(E-h\nu)\{fc(E)-fv(E-h\nu)\}dE > 0$$

Since $\sigma_c(E)$ and $\sigma_v(E)$ are always positive numbers, a relation $fc(E) > fv(E-h\nu)$ is obtained. This condition of inequality is satisfied when $Eg < h\nu < E_{FC} - E_{FV}$.

For example, Esaki et al., "Superlattice and Negative Differential Conductivity in Semiconductors", IBM Journal of Research and Developments, pp. 61–65, January 1970 discloses an example of the superlattice. But no reports are made on semiconductor lasers and light emitting diodes.

Next, a description will be given of the superlattice. It is possible to produce a superlattice, that is, a periodic repetition of different semiconductors like AlGaAs/GaAs/AlGaAs/GaAs, by use of a crystal growing method such as the MBE which can control a thickness of a grown layer with a high accuracy. In this case, the band structure of the conduction band does not become a continuous energy distribution like the band structure 6 of the bulk GaAs shown in FIG. 4A but becomes a discontinuous energy distribution like the superlattice band structure 7 shown in FIG. 4B including the mini-bandgaps 5a and 5b.

However, according to the semiconductor laser shown in FIG. 1, the light emission wavelength is determined by the energy bandgap Eg peculiar to the material used. For this reason, it is necessary to use a mixed crystal semiconductor including three or four elements in order to obtain a desired light emission wavelength especially over a wide range, but there is a problem in that it is difficult to obtain a satisfactory single crystal.

SUMMARY OF THE INVENTION

Accordingly, it is a general object of the present invention to provide a novel and useful semiconductor device in which the problems described above are eliminated.

Another and more specific object of the present invention is to provide a semiconductor device comprising an anode layer, a first semiconductor layer formed on the anode layer, a first cladding layer formed on the first semiconductor layer and having a superlattice structure, an active layer formed on the first cladding layer and having a superlattice structure, a second cladding layer formed on the active layer and having a superlattice structure, a cathode barrier layer formed on the second cladding layer, a second semiconductor layer formed on the cathode barrier layer, and a cathode layer formed on the second semiconductor layer. The cathode barrier layer allows electrons to tunnel therethrough when a voltage is applied across the anode and cathode layers so that a potential on a side of the superlattices is positive with respect to the cathode barrier layer, and the active layer has the superlattice with a bottom energy of a miniband from which electrons transit to a lower miniband with a light emission which bottom energy is smaller than those of the superlattices of the first and second cladding layers. According to the semiconductor device of the present invention, it is possible to easily obtain an arbitrary light emission wavelength over a wide range, and a satisfactory crystal state can be obtained with ease.

Still another object of the present invention is to provide a semiconductor device described above and further comprising a plurality of insulation layers respectively extending in a first direction in each of said active layer and said first and second cladding layers and provided intermittently along a second direction which is perpendicular to the first direction, where the first and second directions are perpendicular to a direction in which layers of the superlattices are stacked. According to the semiconductor device of the present invention, it possible to more sharply determine the light emission wavelength.

Other objects and further features of the present invention will be apparent from the following detailed description when read in conjunction with the accompanying drawings.

DETAILED DESCRIPTION

Figure 5:
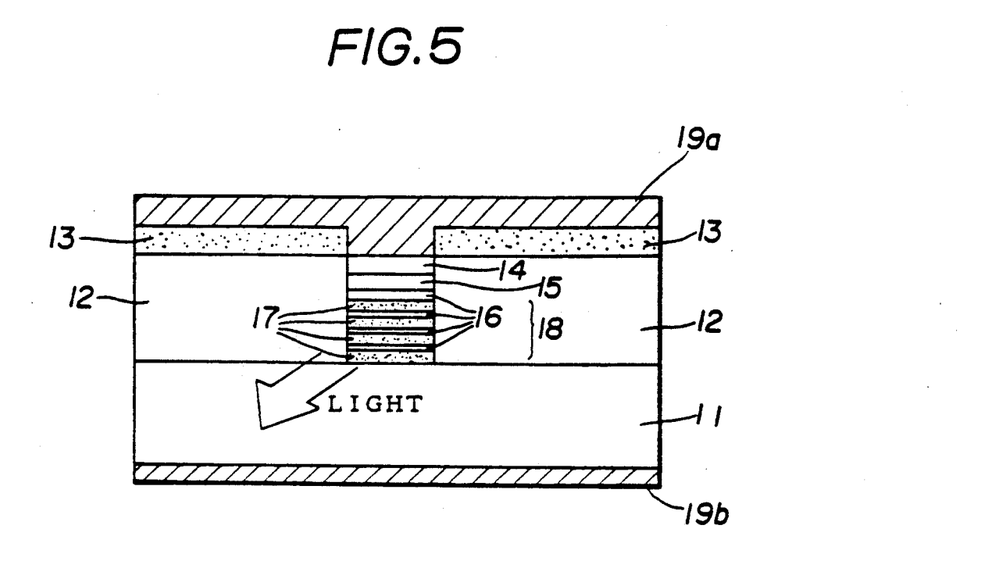
FIG. 5 is a cross sectional view showing a first embodiment of a semiconductor device according to the present invention.
Figure 6:
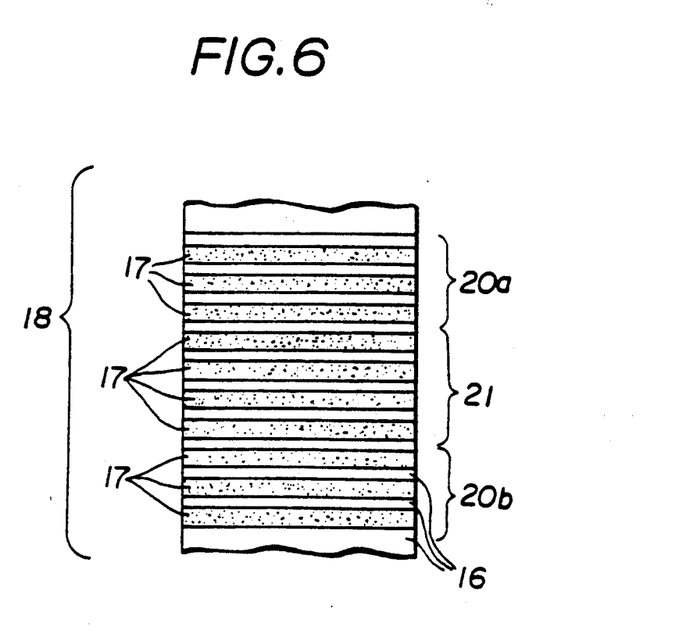
FIG. 6 is a cross sectional view showing a portion of the first embodiment on an enlarged scale for explaining details of a superlattice portion of the first embodiment.
Figure 7:
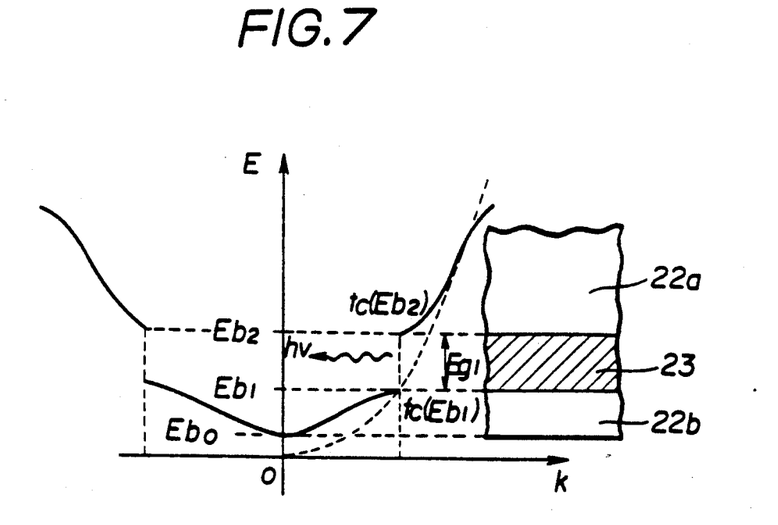
FIG. 7 is a diagram for explaining a light emission caused by a mini-bandgap of the first embodiment.
Figure 8:
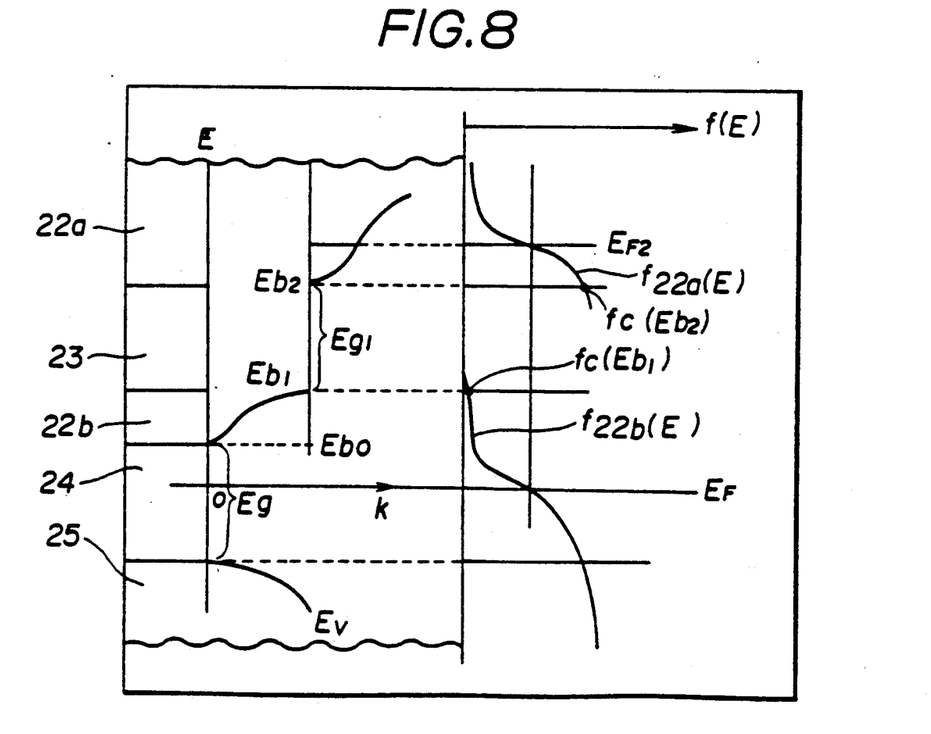
FIG. 8 is a diagram for explaining a band structure and distribution functions of the first embodiment.
Figure 9:
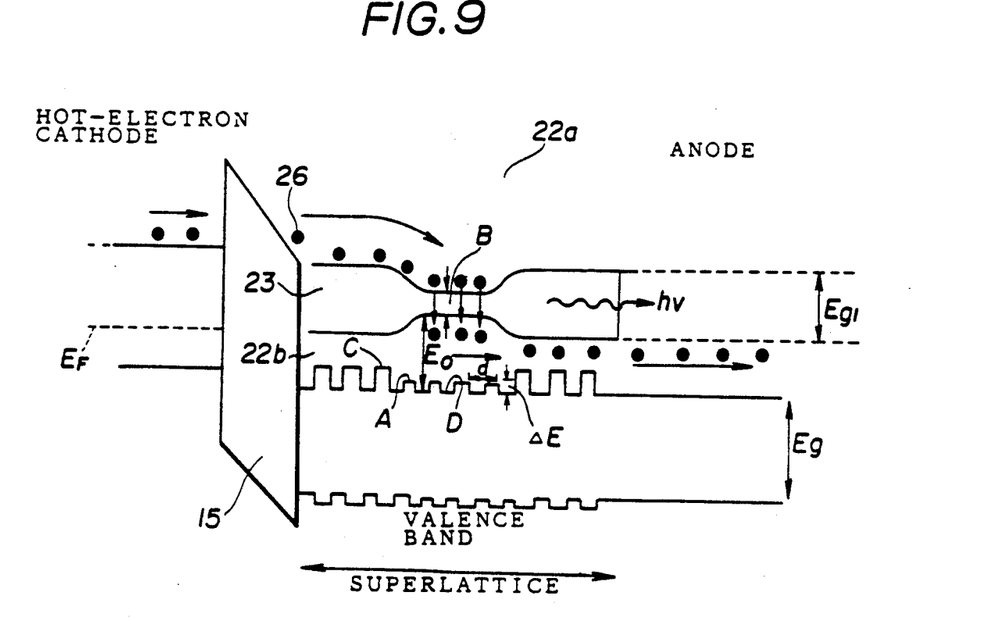
FIG. 9 is a diagram for explaining a light emission phenomenon which occurs in the first embodiment.

A description will be given of a first embodiment of a semiconductor device according to the present invention. FIG. 5 is a cross sectional view showing a first embodiment of a semiconductor device according to the present invention, and FIG. 6 is a cross sectional view showing a portion of the first embodiment on an enlarged scale for explaining details of a superlattice portion of the first embodiment. FIG. 7 is a diagram for explaining a light emission caused by a mini-bandgap of the first embodiment, FIG. 8 is a diagram for explaining a band structure and distribution functions of the first embodiment, and FIG. 9 is a diagram for explaining a light emission phenomenon which occurs in the first embodiment. In FIGS. 7 through 9, elements which correspond to those elements shown in FIGS. 2, 3, 4A and 4B are designated by the same reference characters.

FIG. 5 shows a case where the present invention is applied to a GaAs/AlGaAs system buried heterojunction type semiconductor laser. In FIGS. 5 and 6, the semiconductor laser has an $n^+$-type GaAs substrate 11 using a (100) plane, an intrinsic AlGaAs buried layer 12, an SiON insulator layer 13, an $n^+$-type GaAs semiconductor layer 14, an intrinsic AlGaAs cathode barrier layer 15, $n^+$-type GaAs semiconductor layers 16, $n^+$-type AlGaAs semiconductor layers 17, a superlattice portion 18, and electrodes 19a and 19b respectively made up of a AuGe/Ni/Au structure. Cladding layers 20a and 20b have the superlattices respectively made up of a AlGaAs/GaAs . . . /GaAs structure, and an active layer 21 has the superlattice made up of a AlGaAs/ . . . /GaAs structure. In FIG. 6, the superlattices of the cladding layers 20a and 20b and the active layer 21 are only generally shown, but these superlattices actually consist of a sufficiently large number of thin semiconductor layers.

In FIGS. 7 through 9, 23 denotes a mini-bandgap, 24 denotes a bandgap, 25 denotes a valence band, 26 denotes electrons, Eg1 denotes a magnitude of the minibandgap 23, Eb1 denotes an energy at a top of a miniband 22b, Eb2 denotes an energy at a bottom of a miniband 22a, fc(Eb1) denotes a distribution function of the electrons at the energy at the top of the miniband 22b, and fc(Eb2) denotes a distribution function of the electrons at the energy at a bottom of the miniband 22a.

This embodiment uses a light emission phenomenon which is caused by an electron transition in the minibandgap 23 due to the superlattice which is a repetition of compound semiconductor heterojunctions, and it is possible to easily and appropriately change the period and composition ratio of the superlattice and the materials used for the superlattice. As a result, an arbitrary light emission wavelength can be obtained easily over a wide range, and a satisfactory crystal state can be obtained with ease.

A description will now be given of the light emission phenomenon at the time when the electron transition takes place in the mini-bandgap 23. As shown in FIGS. 7 and 8, the condition for amplification for continuous light emission is as follows, where B is a transition rate for stimulated emission, $\rho$ is the photon number, $\sigma_{22i}$ and $f_{22i}$ respectively are the density of states and the distribution functions in i-miniband.

$$B\rho \int \sigma_{22b}(E)\sigma_{22a}(E-h\nu)\{f_{22b}(E)-f_{22a}(E-h\nu)\}dE > 0$$

Since $\sigma_{22a}(E)$ and $\sigma_{22b}(E)$ are positive, this condition is satisfied when $Egl < h\nu < E_{F2} - Ebo$, where $Ebo$ is a bottom energy of the conduction band. Under this condition, the light $h\nu$ which corresponds to the magnitude of the mini-bandgap $Egl$ is mainly emitted.

The distribution function $f_{22b}(E)$ of the electrons at the bottom of the miniband 22a is made greater than the distribution function $f_{22a}(E)$ of the electrons at the top of the miniband 22b as follows. That is, as shown in FIG. 9, a voltage is applied across the electrodes 19a and 19b so that a potential on the superlattice side of the cathode barrier layer 15 (a hot-electron cathode) becomes positive. In this case, a potential difference occurs and the electrons 26 tunnel through the cathode barrier layer 15 into the miniband 22a having an energy level higher than that of the mini-bandgap 23, thereby increasing the distribution function fc(Eb2) of the electrons 26 in the miniband 22a. In order that the injected electrons 26 do not flow to the anode, a barrier height of the superlattice is made low at a portion A, and a portion B of the mini-bandgap 23 is made narrow as shown in FIG. 9. The portions A and B may be set in this manner by appropriately selecting the materials used for the superlattice. For example, an Al content in the portion A having the composition AlGaAs is less than an Al content in a portion C and the composition of the portion A is close to the composition GaAs of the portion D. In addition, the electrons 26 cause the light emission and move into the miniband 22b. An energy Eo of the mini-bandgap 23 and the magnitude Eg of the mini-bandgap 23 can be adjusted appropriately by adjusting a barrier height $\Delta E$ and a period d of the superlattice, that is, by changing the materials used for the superlattice little by little, and it is also possible to appropriately adjust the light emission wavelength.

In this embodiment, the present invention is applied to the buried heterojunction type semiconductor laser, but it is of course possible to apply the present invention to a light emitting diode or the like. The present invention is applicable to any type of semiconductor lasers and light emitting diodes which use the light emission phenomenon caused by the electron transition in the mini-bandgap due to the superlattice structure.

Figure 10:
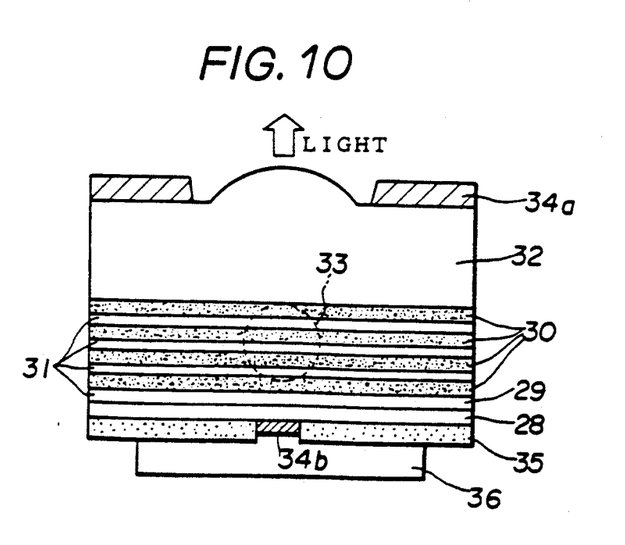
FIG. 10 is a cross sectional view showing a second embodiment of the semiconductor device according to the present invention.

FIG. 10 is a cross sectional view showing a second embodiment of the semiconductor device according to the present invention. FIG. 10 shows a case where the present invention is applied to a light emitting diode. The light emitting diode has an n+-type GaAs semiconductor layer 28, an intrinsic AlGaAs cathode barrier layer 29, an n+-type AlGaAs semiconductor layer 30, an n+-type GaAs semiconductor layer 31, n-type GaAs substrate 32, a light emitting region 33, electrodes 34a and 34b respectively having a AuGe/Ni/Au structure, a SiON insulator layer 35, and an Au plated layer 36.

Next, a description will be given of a third embodiment of the semiconductor device according to the present invention. This embodiment may take the structure shown in FIG. 5 or 10, and the superlattice portion has a $Al_xGa_{1-x}As/GaAs$ structure. A cladding layer on the cathode side is made up of a superlattice having a n+-type GaAs/n--type $Al_{0.35}Ga_{0.65}As$ structure, where each n+-type GaAs layer c has a thickness of 40 Å and is doped with Si to $5 \times 10^{18}$ cm$^{-3}$ and each n--type $Al_{0.35}Ga_{0.65}As$ layer b has a thickness of 30 Å and is doped with Si to $1 \times 10^{17}$ cm$^{-3}$. A cladding layer on the anode side is made up of a superlattice having a n+-type GaAs/n--type $Al_{0.45}Ga_{0.55}As$ structure, where each n+-type GaAs layer c has a thickness of 40 Å and is doped with Si to $5 \times 10^{18}$ cm$^{-3}$ and each n--type $Al_{0.45}Ga_{0.55}As$ layer d has a thickness of 10 Å and is doped with Si to $1 \times 10^{17}$ cm$^{-3}$. An active layer between the cladding layers on the cathode and anode sides is made up of a superlattice having a n--type $Al_{0.25}Ga_{0.75}As/n^+$-type GaAs structure, where each n--type $Al_{0.25}Ga_{0.75}As$ layer a has a thickness of 30 Å and is doped with Si to $1 \times 10^{17}$ cm$^{-3}$ and each n+-type GaAs layer c has a thickness of 40 Å and is doped with Si to $5 \times 10^{18}$ cm$^{-3}$.

Figure 11:
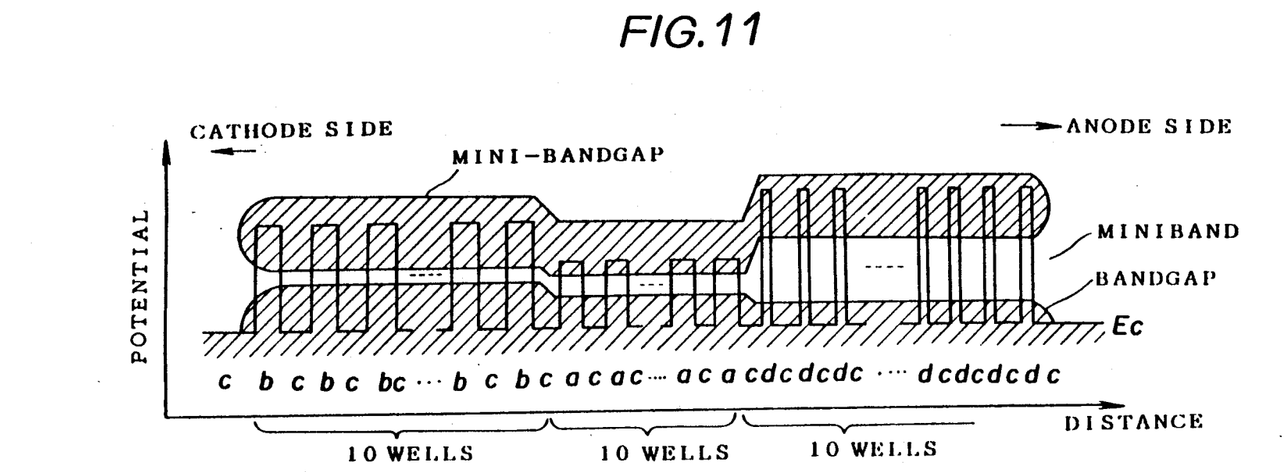
FIG. 11 shows a band diagram obtained in a third embodiment of the semiconductor device according to the present invention.

FIG. 11 shows a band diagram obtained in this third embodiment. In FIG. 11, hatched portions indicate the bandgaps, where the upper hatched portion is the mini-bandgap. It may be seen that a potential well is formed in the light emitting region due to a miniband, and the electrons are trapped in the light emitting region by this potential well. The height of the mini-bandgap on the anode side is higher than that on the cathode side, making it possible to satisfactorily trap the electrons. In addition, the bottom of the miniband of the active layer is higher than the potential of the cladding layer on the anode side so that the electrons after the transition in the miniband are drawn toward the anode side. The bottom of the miniband in the active layer is lower than that of the cladding layer on the cathode side so that the electrons do not move back toward the cathode. When a magnitude of the mini-bandgap is 0.116 eV, it is possible to obtain a light having a wavelength of approximately 10.6 μm which is a wavelength sufficient to obtain a large air transmittance and is approximately the same as the light emission wavelength of $CO_2$ lasers.

Figure 12:
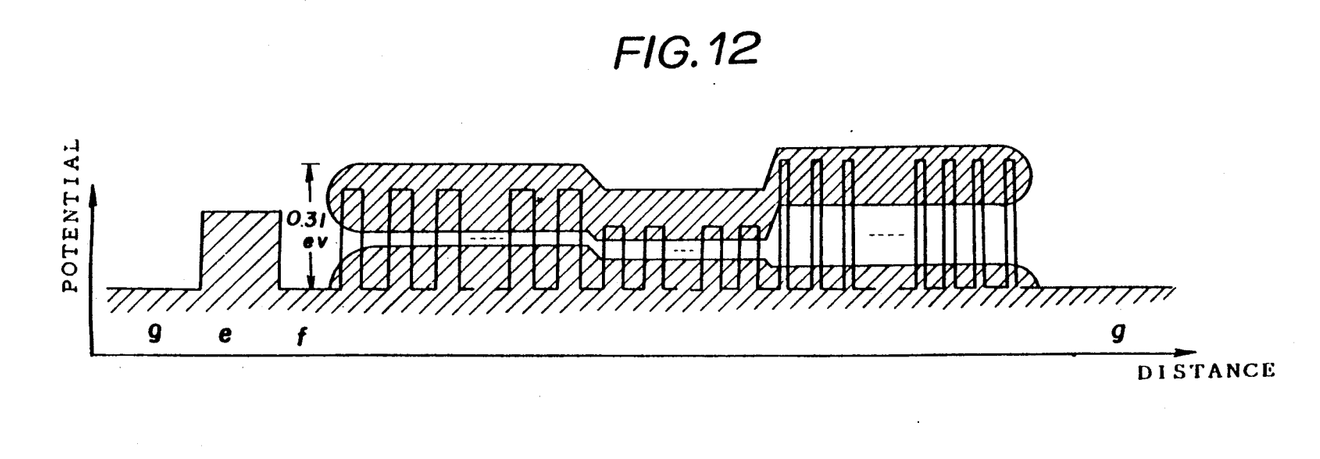
FIG. 12 shows the band diagram of FIG. 11 with a cathode barrier layer and cathode and anode layers.

FIG. 12 shows the band diagram of FIG. 11 with a cathode barrier layer e and cathode and anode layers f and g. The cathode barrier layer e is made of intrinsic $Al_{0.3}Ga_{0.7}As$ and has a thickness of 100 Å. The cathode and anode layers f and g are respectively made of n+-type GaAs doped with Si to $5 \times 10^{18}$ and have a thickness of 100 Å.

Figure 13A:
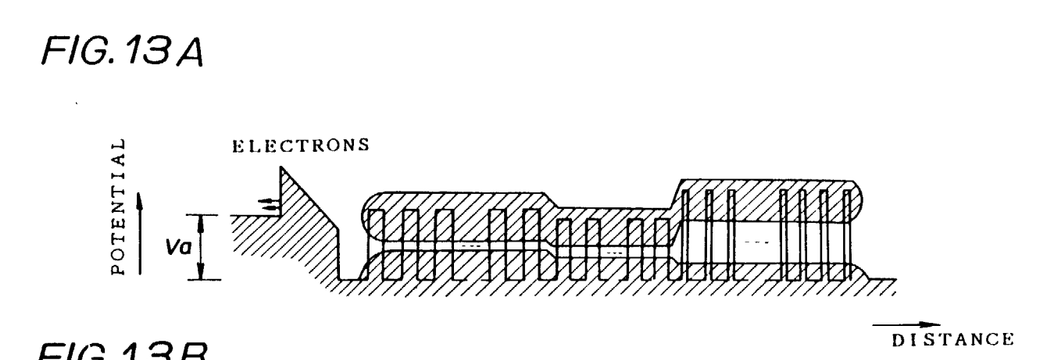
FIGS. 13A and 13B are band diagrams for explaining a light emission which occurs only when a suitable voltage is applied across the cathode and anode in the third embodiment.
Figure 13B:
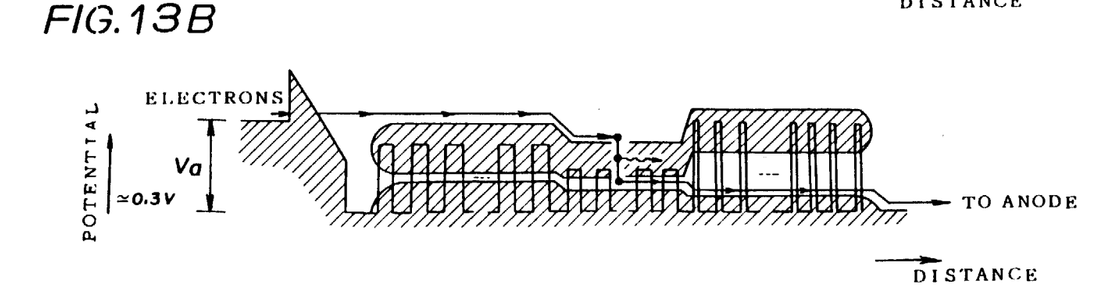
Figure 14:
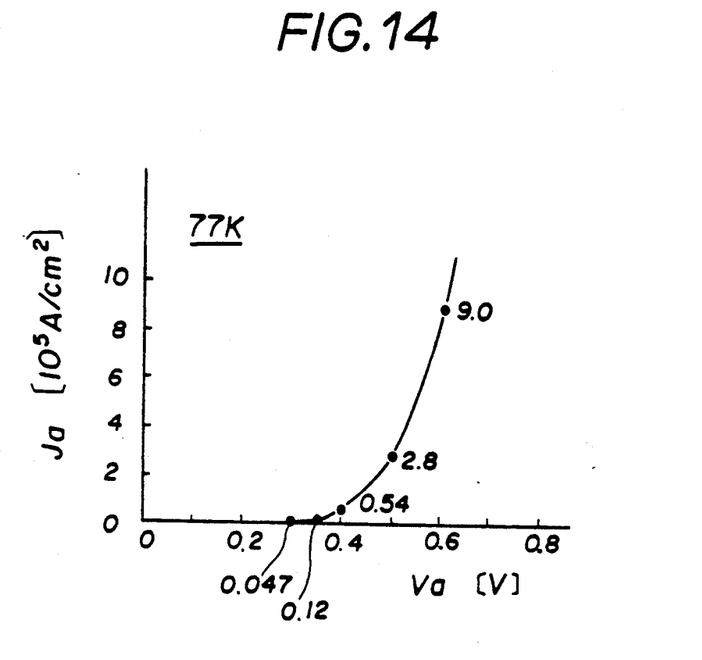
FIG. 14 shows an anode voltage versus anode current density characteristic of the third embodiment at 77 K.
Figure 15:
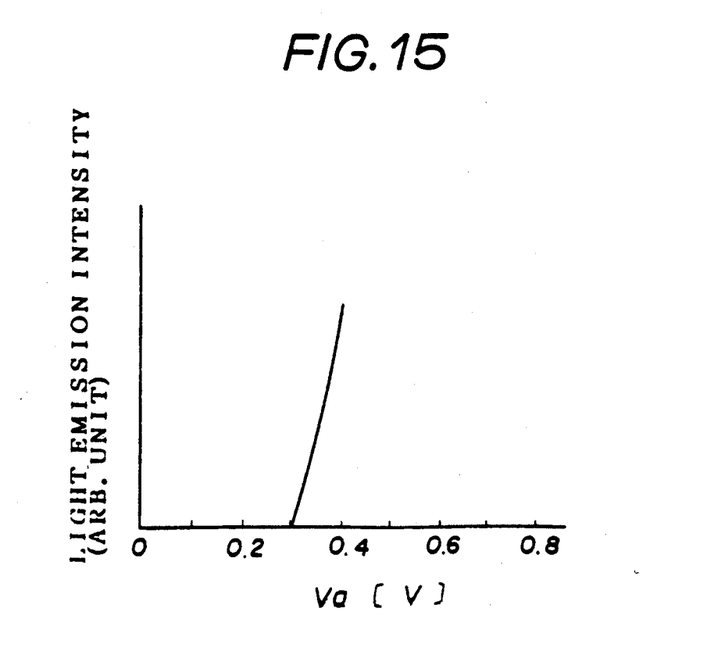
FIG. 15 shows an anode voltage versus light emission intensity characteristic of the third embodiment.

FIGS. 13A and 13B are band diagrams for explaining the light emission which occurs only when a suitable voltage is applied across the cathode and anode. FIG. 13A shows a case where an anode voltage Va is small, and in this case, the electrons cannot tunnel through the cathode barrier layer e. But when the anode voltage Va becomes approximately 0.3 V and sufficiently large, the electrons tunnel through the cathode barrier layer e and the light emission occurs in the miniband. FIG. 14 shows an anode voltage versus anode current density characteristic of this embodiment at 77 K. It is seen from FIG. 14 that a current flows, that is, the light emission occurs, when the anode voltage Va is approximately 0.3 V or greater. On the other hand, FIG. 15 shows an anode voltage versus light emission intensity characteristic, where the ordinate indicate the light emission intensity in an arbitrary unit.

Next, a description will be given of a fourth embodiment of the semiconductor device according to the present invention. This embodiment may take the structure shown in FIG. 5 or 10, and the superlattice portion has a $Al_{0.48}In_{0.52}As/In_{0.53}Ga_{0.47}As$ structure. A cladding layer on the cathode side is made up of a superlattice having a n-type AlInAs/n+-type InGaAs structure, where each n-type AlInAs layer j has a thickness of 25 Å and is doped with Si to $1 \times 10^{17}$ cm$^{-3}$ and each n+-type InGaAs layer k has a thickness of 15 Å and is doped with Si to $1 \times 10^{19}$ cm$^{-3}$. A cladding layer on the anode side is made up of a superlattice having a n-type AlInAs/n+-type InGaAs structure, where each n-type AlInAs layer n has a thickness of 20 Å and is doped with Si to $5 \times 10^{17}$ cm$^{-3}$ and each n+-type InGaAs layer o has a thickness of 20 Å and is doped with Si to $1 \times 10^{19}$ cm$^{-3}$. An active layer between the cladding layers on the cathode and anode sides is made up of a superlattice having a n+-type InGaAs/n-type AlInAs structure, where each n+-type InGaAs layer 1 has a thickness of 30 Å and is doped with Si to $1 \times 10^{19}$ cm$^{-3}$ and each n-type AlInAs layer m has a thickness of 30 Å and is doped with Si to $1 \times 10^{17}$ cm$^{-3}$. A cathode barrier layer q is made of n-type AlInAs doped with Si to $1 \times 10^{17}$ and has a thickness of 100 Å, and a semiconductor layer p is made of n+-type InGaAs doped with Si to $1 \times 10^{19}$ and has a thickness of 200 Å. A cathode layer r is made of n+-type InGaAs doped with Si to $1 \times 10^{19}$ and an anode layer s is made of n+-type InGaAs doped with Si to $1 \times 10^{19}$.

Figure 16:
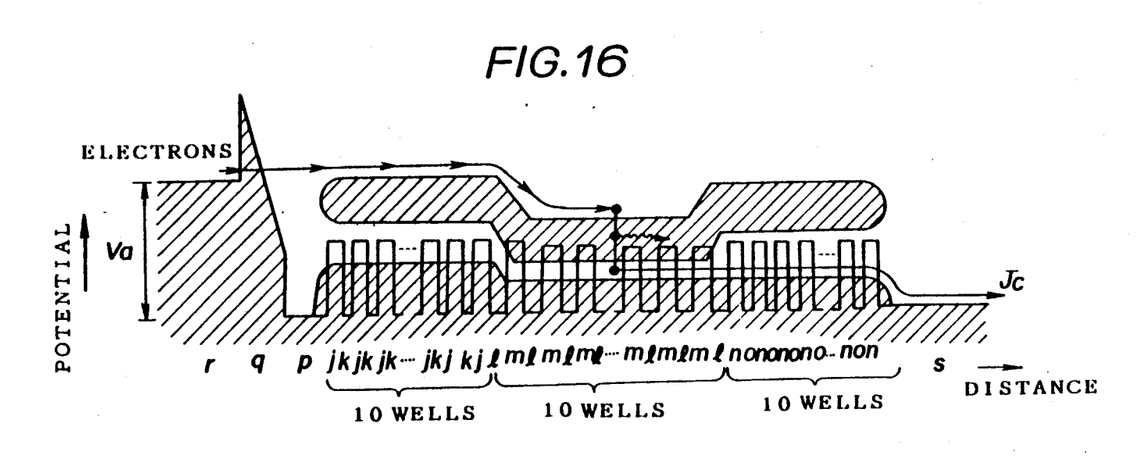
FIG. 16 shows a band diagram obtained in a fourth embodiment of the semiconductor device according to the present invention.

FIG. 16 shows a band diagram obtained in this fourth embodiment. In FIG. 16, hatched portions indicate the bandgaps, where the upper hatched portion is the mini-bandgap. It may be seen that a potential well is formed in the light emitting region due to a miniband, and the electrons are trapped in the light emitting region by this potential well. In addition, a potential of the active layer is same as the potential of the cladding layer on the anode side so that the electrons after the transition in the miniband are drawn toward the anode side.

Figure 17:
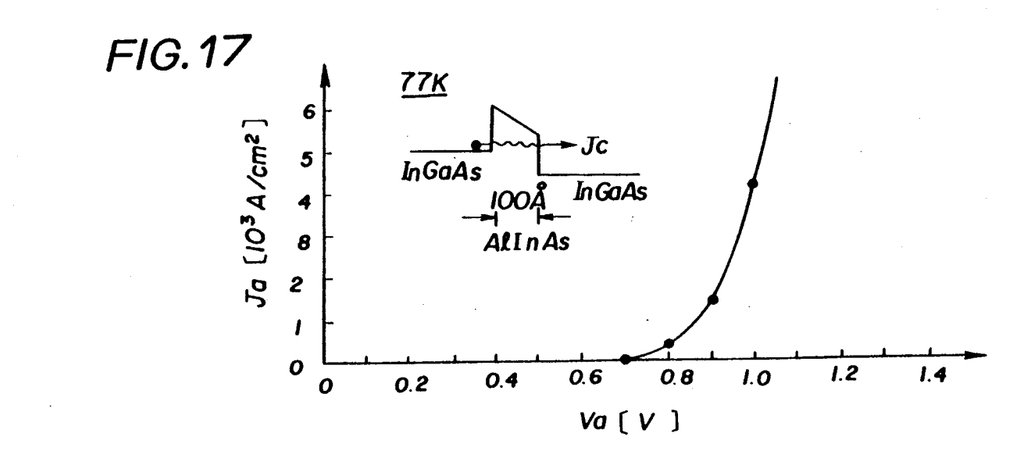
FIG. 17 shows an anode voltage versus anode current density characteristic of the fourth embodiment at 77 K.

FIG. 17 shows an anode voltage versus anode current density characteristic of this embodiment at 77 K. It is seen from FIG. 17 that a current flows, that is, the light emission occurs, when the anode voltage Va is approximately 0.7 V or greater.

In the embodiments described above, the superlattice, that is, the periodic repetition of different semiconductors, occurs along the depth direction of the semiconductor device. In other words, the superlattice is formed along the vertical direction in FIGS. 5 and 10. However, a plurality of isolation layers may be provided along a direction perpendicular to the direction in which the superlattice is formed, so that the miniband structure of the superlattice can be varied more finely.

Figure 18:
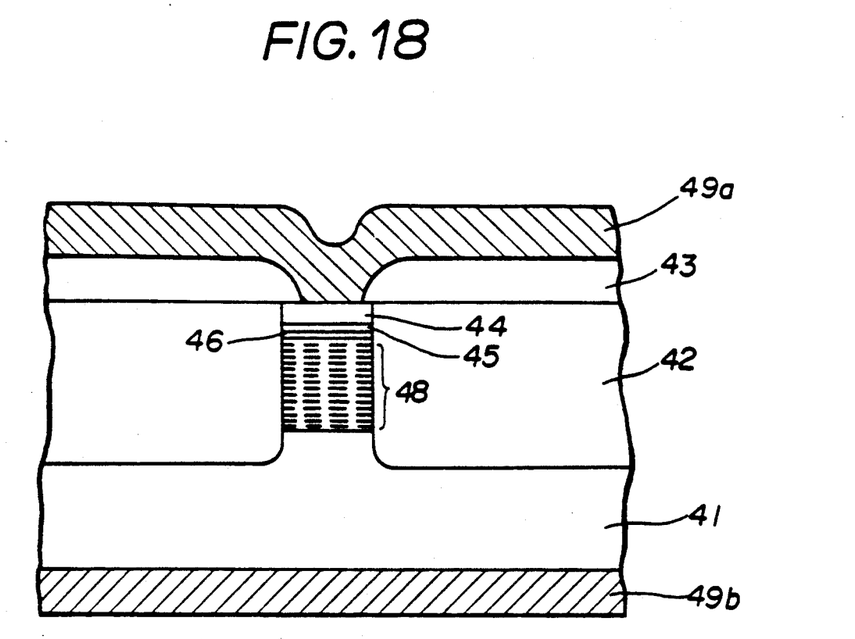
FIG. 18 is a cross sectional view showing a fifth embodiment of the semiconductor device according to the present invention.
Figure 19:
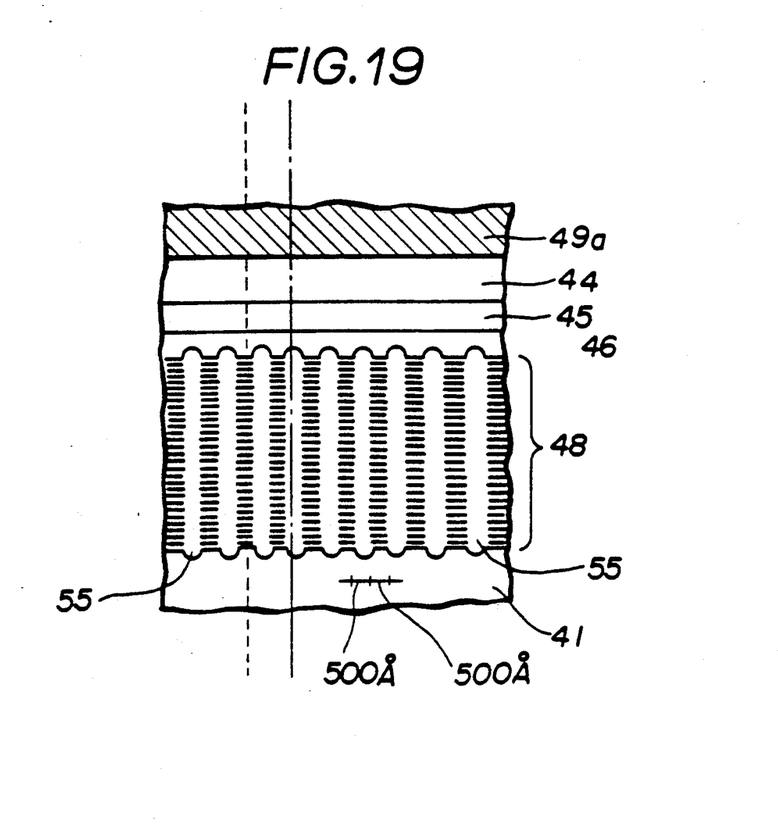
FIG. 19 is a cross sectional view showing a portion of the fifth embodiment on an enlarged scale for explaining details of a superlattice portion of the fifth embodiment.

FIG. 18 is a cross sectional view showing a fifth embodiment of a semiconductor device according to the present invention, and FIG. 19 is a cross sectional view showing a portion of the fifth embodiment on an enlarged scale for explaining details of a superlattice portion of the fifth embodiment.

In FIGS. 18 and 19, a semiconductor laser has an n+-type GaAs substrate 41, a p-type AlGaAs buried layer 42, an SiO2 insulator layer 43, an n+-type GaAs semiconductor layer 44, an intrinsic AlGaAs cathode barrier layer 45, n+-type GaAs semiconductor layers 46, n+-type AlGaAs semiconductor layers 47, a superlattice portion 48, and electrodes 49a and 49b. Cladding layers 50a and 50b have the superlattices respectively made up of a AlGaAs/GaAs . . . /GaAs structure, and an active layer 51 has the superlattice made up of a AlGaAs/ . . . /GaAs structure. In FIG. 19, the superlattices of the cladding layers 50a and 50b and the active layer 51 are only generally shown, but these superlattices actually consist of an extremely large number of thin semiconductor layers. Furthermore, in this embodiment, isolation layers 55 are formed by an O+ FIB ion implantation to section the superlattice portion 48 in the horizontal direction in FIG. 19. In other words, the isolation layers 55 run perpendicularly to the paper in FIG. 19. As a result, the superlattice structure, that is, the periodic repetition of different semiconductors substantially occur both in the vertical and horizontal directions in FIGS. 18 and 19.

The band diagram for this embodiment at a portion cut along a phantom line in FIG. 19 is basically the same as those shown in FIGS. 11 and 12. However, no current flows and thus no light emission occurs at a portion cut along a one-dot chain line in FIG. 19. In this embodiment, it is readily seen that the electron mobility is restricted by the structure of the superlattice portion 48, thereby making it possible to more sharply determine the light emission wavelength.

In the described embodiments, the cathode barrier layer is made of a semiconductor, but it is also possible to use an insulator for the cathode barrier layer.

Further, the present invention is not limited to these embodiments, but various variations and modifications may be made without departing from the scope of the present invention.

What is claimed is:

1. A semiconductor device comprising:
   an anode layer;
   a first semiconductor layer formed on said anode layer;
   a first cladding layer formed on said first semiconductor layer and having a superlattice structure;
   an active layer formed on said first cladding layer and having a superlattice structure;
   a second cladding layer formed on said active layer and having a superlattice structure;
   a cathode barrier layer formed on said second cladding layer;
   a second semiconductor layer formed on said cathode barrier layer; and
   a cathode layer formed on said second semiconductor layer,
   said cathode barrier layer allowing electrons to tunnel therethrough when a voltage is applied across said anode and cathode layers so that a potential on a side of the superlattices is positive with respect to said cathode barrier layer,
   said active layer having the superlattice with a bottom energy of a miniband from which electrons transit to a lower miniband with a light emission which bottom energy is smaller than those of the superlattices of said first and second cladding layers.

2. The semiconductor device as claimed in claim 1 wherein a mini-bandgap formed by the superlattice of said active layer is narrow compared to those of said first and second cladding layers.

3. The semiconductor device as claimed in claim 1 wherein said first and second semiconductor layers are made of a first semiconductor, said first cladding layer comprises as its superlattice a periodic repetition of two layers respectively made of a second semiconductor and the first semiconductor, said active layer comprises as its superlattice a periodic repetition of two layers respectively made of the second and first semiconductors, and said second cladding layer comprises as its superlattice a periodic repetition of two layers respectively made of the second and first semiconductors.

4. The semiconductor device as claimed in claim 3 wherein said first and second semiconductors respectively are n+-type GaAs and n+-type AlGaAs.

5. The semiconductor device as claimed in claim 4 wherein said cathode barrier layer is made of intrinsic AlGaAs.

6. The semiconductor device as claimed in claim 4 wherein an Al content in the superlattice of said active layer is smaller than that in the superlattice of said second cladding layer.

7. The semiconductor device as claimed in claim 3 wherein said first and second semiconductors respectively are n+-type InGaAs and n-type AlInAs.

8. The semiconductor device as claimed in claim 7 wherein said cathode barrier layer is made of n-type AlInAs.

9. The semiconductor device as claimed in claim 1 wherein said first and second semiconductor layers are respectively made of a first semiconductor, said first cladding layer comprises as its superlattice a periodic repetition of two layers respectively made of a second semiconductor and the first semiconductor, said active layer comprises as its superlattice a periodic repetition of two layers respectively made of a third semiconductor and the first semiconductor, and said second cladding layer comprises as its superlattice a periodic repetition of two layers respectively made of a fourth semiconductor and the first semiconductor.

10. The semiconductor device as claimed in claim 9 wherein said first, second, third and fourth semiconductors respectively are n+-type GaAs, n−-type $Al_{0.45}Ga_{0.55}As$, n−-type $Al_{0.25}Ga_{0.75}As$ and n−-type $Al_{0.35}Ga_{0.65}As$.

11. The semiconductor device as claimed in claim 10 wherein said cathode barrier layer is made of intrinsic $Al_{0.3}Ga_{0.7}As$.

12. The semiconductor device as claimed in claim 1 wherein a barrier height of a miniband formed by the superlattice of said first cladding layer is greater than that of said second cladding layer.

13. The semiconductor device as claimed in claim 1 wherein a bottom of a miniband formed by the superlattice of said active layer is greater than or equal to that of said first cladding layer.

14. The semiconductor device as claimed in claim 1 which further comprises a plurality of isolation layers respectively extending in a first direction in each of said active layer and said first and second cladding layers and provided intermittently along a second direction which is perpendicular to the first direction, said first and second directions being perpendicular to a direction in which layers of the superlattices are stacked.

15. The semiconductor device as claimed in claim 1 wherein said first cladding layer, said active layer, said second cladding layer, said cathode barrier layer and said second semiconductor layer are embeddedly provided in a buried layer formed on said first semiconductor layer, said semiconductor device constituting a semiconductor laser.

16. The semiconductor device as claimed in claim 1 which constitutes a light emitting diode.

* * * * *

UNITED STATES PATENT AND TRADEMARK OFFICE
CERTIFICATE OF CORRECTION

PATENT NO. : 5,027,164
DATED : June 25, 1991
INVENTOR(S) : AWANO

It is certified that error appears in the above-identified patent and that said Letters Patent is hereby corrected as shown below:

In the drawings, Sheet 7 of 10 should be the attached copy of FIGS. 13A and 13B.

Col. 1,     line 34, change "has" to --have--.

Col. 4,     line 43, change "a" to --an--;
             line 44, change "a" to --an--.

Col. 6,     line 2, change "a" to --an--;
             line 3, change "a" (second occurrence) to --an--;
             line 9, change "a" (second occurrence) to --an--;
             line 16, change "a" (second occurrence) to --an--;
             line 67, change "indicate" to --indicates--.

Col. 7,     line 5, change "a" to --an--;
             line 7, change "a" to --an--;
             line 12, change "a" (second occurrence) to --an--;
             line 19, changae "a" to --an--.

Signed and Sealed this

Thirteenth Day of July, 1993

Attest:

MICHAEL K. KIRK

*Attesting Officer*      *Acting Commissioner of Patents and Trademarks*